US012796378B2

(12) United States Patent
Nagasawa et al.

(10) Patent No.: US 12,796,378 B2
(45) Date of Patent: Nov. 10, 2026

(54) SEMICONDUCTOR MANUFACTURING APPARATUS

(71) Applicant: EBARA CORPORATION, Tokyo (JP)

(72) Inventors: Yosuke Nagasawa, Tokyo (JP); Tensei Sato, Tokyo (JP); Hideki Wakabayashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 483 days.

(21) Appl. No.: 18/280,137

(22) PCT Filed: Mar. 3, 2022

(86) PCT No.: PCT/JP2022/009084
§ 371 (c)(1),
(2) Date: Sep. 1, 2023

(87) PCT Pub. No.: WO2022/186324
PCT Pub. Date: Sep. 9, 2022

(65) Prior Publication Data

US 2024/0145277 A1 May 2, 2024

(30) Foreign Application Priority Data

Mar. 3, 2021 (JP) ................................ 2021-033781

(51) Int. Cl.
*H10P 72/00* (2026.01)
*H10P 72/50* (2026.01)
*H10P 72/76* (2026.01)

(52) U.S. Cl.
CPC ...... *H10P 72/0606* (2026.01); *H10P 72/0616* (2026.01); *H10P 72/53* (2026.01); *H10P 72/7624* (2026.01)

(58) Field of Classification Search
CPC .. H10P 72/0606; H10P 72/7624; H10P 72/53; H10P 72/0616; H01L 21/67; H01L 21/68; H01L 21/687
See application file for complete search history.

(56) References Cited

U.S. PATENT DOCUMENTS 8,514,368 B2 * 8/2013 Bussink ................ G03F 9/7034 355/53
2011/0084903 A1 * 4/2011 Onishi .................. G06F 3/0428 345/157
2019/0189480 A1 * 6/2019 Yamasaki ........... C25D 17/001

FOREIGN PATENT DOCUMENTS

JP S59-019625 A 2/1984
JP S62-229009 A 10/1987
(Continued)

OTHER PUBLICATIONS

International Patent Application No. PCT/JP2022/009084; Int'l Search Report; dated May 31, 2022; 3 pages.

*Primary Examiner* — Catherine T. Rastovski
*Assistant Examiner* — Sharad Timilsina
(74) *Attorney, Agent, or Firm* — BakerHostetler

(57) ABSTRACT

The present invention correctly identifies the size and shape of a substrate in order to avoid damage to a substrate holder and wasteful disposal of a substrate. Provided is a semiconductor manufacturing device for processing a rectangular substrate. This semiconductor manufacturing device: comprises a first sensor pair, which is used to measure a first length of the rectangular substrate along a first line and which comprises a sensor configured to detect the position of one end of the rectangular substrate on the first line and a sensor configured to detect the position of the other end of the rectangular substrate on the first line, and a second sensor pair, which is used to measure a second length of the rectangular substrate along a second line and which com-
(Continued)

prises a sensor configured to detect the position of one end of the rectangular substrate on the second line and a sensor configured to detect the position of the other end of the rectangular substrate on the second line; and identifies the size or shape of the rectangular substrate on the basis of the first length and the second length.

12 Claims, 12 Drawing Sheets

(56) References Cited

FOREIGN PATENT DOCUMENTS

| | | | | |
|---|---|---|---|---|
| JP | H07-110966 | A | | 4/1995 |
| JP | H07110966 | | * | 4/1995 |
| JP | 2001-244313 | A | | 9/2001 |
| JP | 2001-264015 | A | | 9/2001 |
| JP | 2004-058550 | A | | 2/2004 |
| JP | 2008-100324 | A | | 5/2008 |
| JP | 2010-230517 | A | | 10/2010 |
| JP | 4846201 | B2 | | 12/2011 |
| JP | 2015114255 | A | * | 6/2015 |
| JP | 2019-110200 | A | | 7/2019 |

* cited by examiner

SEMICONDUCTOR MANUFACTURING APPARATUS

CROSS-REFERENCE TO RELATED APPLICATIONS

This application is a U.S. national phase application of International Patent Application No. PCT/JP2022/009084 filed Mar. 3, 2022, which claims priority to Japanese Patent Application No. 2021-033781 filed Mar. 3, 2021, which are incorporated by reference in their entirety for any and all purposes.

TECHNICAL FIELD

The present invention relates to a semiconductor manufacturing apparatus.

BACKGROUND ART

There are plural kinds of substrates, which have sizes different from one another, in substrates treated in a semiconductor manufacturing apparatus, and it is necessary to use substrate holders which fit sizes of substrates, respectively (for example, refer to Patent Literature 1). In the case that an inadequate substrate and a substrate holder are combined with each other, there may be a risk that the substrate holder may be damaged, and/or the substrate may be damaged and may accordingly be required to be discarded.

CITATION LIST

Patent Literature

PTL 1: Japanese Patent Publication No. 4846201

SUMMARY OF INVENTION

Technical Problem

For preventing damaging of a substrate holder and wasteful discarding of a substrate, it is important to correctly recognize the size, shape, or the like of a substrate.

Solution to Problem (Mode 1) According to mode 1, a semiconductor manufacturing apparatus for processing a rectangular substrate is provided and the semiconductor manufacturing apparatus comprises: a first sensor pair for measuring a first length of the rectangular substrate along a first line, wherein the first sensor pair comprises a sensor constructed to detect a position of one edge of the rectangular substrate on the first line, and a sensor constructed to detect a position of the other edge of the rectangular substrate on the first line; a second sensor pair for measuring a second length of the rectangular substrate along a second line, wherein the second sensor pair comprises a sensor constructed to detect a position of one edge of the rectangular substrate on the second line, and a sensor constructed to detect a position of the other edge of the rectangular substrate on the second line; and one or plural processors, wherein the processor is constructed to: calculate the first length based on the positions of the one edge and the other edge, that are on the first line and detected by the first sensor pair, of the rectangular substrate; calculate the second length based on the positions of the one edge and the other edge, that are on the second line and detected by the second sensor pair, of the rectangular substrate; and identify the size or the shape of the rectangular substrate, based on the calculated first length and the calculated second length.

(Mode 2) According to mode 2 which comprises the semiconductor manufacturing apparatus in the mode 1, the first sensor pair and the second sensor pair are arranged in such a manner that the first line and the second line correspond to a lateral direction and a longitudinal direction, respectively, in the rectangular substrate.

(Mode 3) According to mode 3 which comprises the semiconductor manufacturing apparatus in the mode 2, the semiconductor manufacturing apparatus further comprises a third sensor pair for measuring a third length of the rectangular substrate along a third line parallel to the first line or the second line, wherein the third sensor pair comprises a sensor constructed to detect a position of one edge of the rectangular substrate on the third line, and a sensor constructed to detect a position of the other edge of the rectangular substrate on the third line; and the processor is further constructed to: calculate the third length based on the positions of the one edge and the other edge, that are on the third line and detected by the third sensor pair, of the rectangular substrate; and identify deviation of the shape of the rectangular substrate from a square shape or a rectangular shape, based on the calculated first length, the calculated second length, and the calculated third length.

(Mode 4) According to mode 4 which comprises the semiconductor manufacturing apparatus in the mode 1, the first sensor pair and the second sensor pair are arranged in such a manner that two diagonal lines of the rectangular substrate are set as the first line and the second line, respectively.

(Mode 5) According to mode 5 which comprises the semiconductor manufacturing apparatus in the mode 4, the processor is further constructed to identify deviation of the shape of the rectangular substrate from a square shape or a rectangular shape, based on the calculated first length and the calculated second length.

(Mode 6) According to mode 6 which comprises the semiconductor manufacturing apparatus in any one of the modes 1-3, the two sensors included in each of the sensor pairs comprise a light emitter which emits belt-shaped measuring light toward the rectangular substrate, and a light receiver which receives a part of the belt-shaped measuring light, wherein the part of the belt-shaped measuring light is light, in the belt-shaped measuring light, that was not blocked by the rectangular substrate; and detection of each of the positions of the rectangular substrate is based on the quantity of light received by the light receiver in the each sensor.

(Mode 7) According to mode 7 which comprises the semiconductor manufacturing apparatus in the mode 4 or 5, each of the two sensors included in each of the sensor pairs is a camera arranged to take an image of one of four corners of the rectangular substrate; detection of the position by each of the sensors is detection of a vertex of the rectangular substrate based on edge detection in the image taken by each of the cameras; and calculation of the first length and the second length is calculation of lengths of the diagonal lines of the rectangular substrate, respectively, based on the detected vertexes.

(Mode 8) According to mode 8 which comprises the semiconductor manufacturing apparatus in any one of the modes 1-7, the semiconductor manufacturing apparatus further comprises a substrate holder storage for storing plural kinds of substrate holders corresponding to rectangular substrates having different sizes and shapes, respectively, wherein each of the substrate holders is that for holding a rectangular substrate; and the processor is further constructed to select, from the substrate holder storage, a substrate holder which fits the identified size or shape of the rectangular substrate.

(Mode 9) According to mode 9 which comprises the semiconductor manufacturing apparatus in any one of the modes 1-8, the semiconductor manufacturing apparatus further comprises a sensor for detecting a warp of the rectangular substrate, wherein the sensor comprises a light emitter which emits belt-shaped measuring light in a direction parallel to the rectangular substrate, and a light receiver which receives a part of the belt-shaped measuring light, wherein the part of the belt-shaped measuring light is light, in the belt-shaped measuring light, that was not blocked by the rectangular substrate; and the processor is further constructed to identify a warp of the rectangular substrate based on the quantity of light received by the light receiver in the sensor.

(Mode 10) According to mode 10 which comprises the semiconductor manufacturing apparatus in any one of the modes 1-9, the processor is further constructed to perform at least one of (i) an action for discontinuing or suspending processing of the rectangular substrate and (ii) an action for communicating an alarm, in the case that the identified size, shape, or warp of the rectangular substrate is judged to be inappropriate in view of a predetermined criteria.

DESCRIPTION OF EMBODIMENTS

In the following description, embodiments of the present invention will be explained with reference to the figures. In the figures which will be explained below, a reference symbol that is the same as that assigned to one component is assigned to the other component which is the same as or corresponds to the one component, and overlapping explanation of these components will be omitted.

Figure 1:
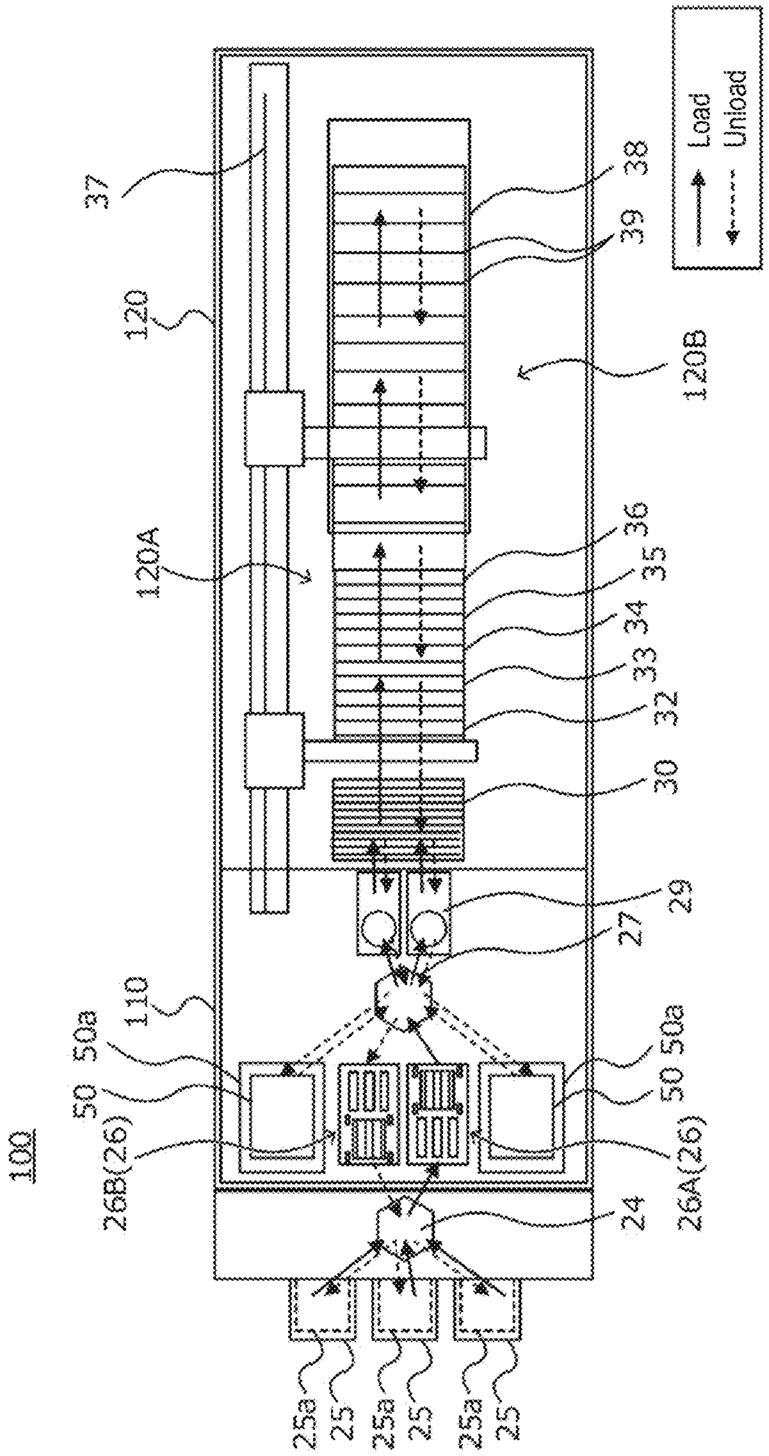
FIG. 1 is a general layout drawing of a plating apparatus according to an embodiment of the present invention.

FIG. 1 is a general layout drawing of a plating apparatus 100 according to an embodiment of the present invention. The plating apparatus 100 is an example of a semiconductor manufacturing apparatus. In the following description, an embodiment of the present invention will be explained with reference to the plating apparatus 100; however, the subject to which the present invention can be applied is not limited to a plating apparatus, and the present invention can be applied, within the scope of the gist of the present invention, to semiconductor manufacturing devices (for example, a CPM (Chemical mechanical Polishing) apparatus and so on) other than a plating apparatus.

As shown in FIG. 1, the plating apparatus 100 is roughly divided into a load/unload module 110 which loads a substrate into a substrate holder (which is not shown in the figure) or unloads a substrate from a substrate holder, a processing module 120 which processes a substrate, and a washing module 50*a*. Further, the processing module 120 comprises a pre-processing/post-processing module 120A which performs pre-processing and post-processing of a substrate, and a plating processing module 120B which applies a plating process to a substrate.

The load/unload module 110 comprises a handling stage 26, a substrate transfer device 27, and a fixing station 29. For example, in the present embodiment, the load/unload module 110 comprises two handling stages 26, specifically, a handling stage 26A for loading, which handles a substrate to which no process has been applied, and a handling stage 26B for unloading, which handles a substrate with respect to which a process applied thereto has been completed. In the present embodiment, the construction of the handling stage 26A for loading is the same as that of the handling stage 26B for unloading, and they are arranged in such a manner that the directions thereof are 180-degree opposite from each other. In this regard, the handling stage 26 is not limited to that comprising the handling stage 26A for loading and the handling stage 26B for unloading, and the handling stages may be used without discrimination, i.e., without setting one of them to be a handling stage for loading and the other of them to be a handling stage for unloading. Further, in the present embodiment, the load/unload module 110 comprises two fixing stations 29. The mechanisms of the two fixing stations 29 are identical with each other; and one, which is free (i.e., which is not handling a substrate), of them is used. In this regard, one or three or more handling stage/stages 26 and one or three or more fixing station/stations 29 may be installed according to the space in the plating apparatus 100.

Substrates are conveyed from plural cassette tables 25 (for example, three in FIG. 1) to the handling stage 26 (the handling stage 26A for loading) via a robot 24. The cassette table 25 is provided with a cassette 25*a* in which a substrate is stored. For example, the cassette is a FOUP. The handling stage 26 is constructed in such a manner that it adjusts (aligns) the position and the direction of a substrate put thereon. The substrate transfer device 27 is arranged in a position between the handling stage 26 and the fixing station 29 for conveying a substrate between them. The substrate transfer device 27 is constructed to convey a substrate between the handling stage 26, the fixing station 29, and the washing module 50*a*. Further, a stocker 30, which is used for storing substrate holders, is installed in a position near the fixing station 29.

The washing module 50*a* comprises a washing device 50 which washes a substrate, with respect to which a plating process applied thereto has been completed, and dries it. The substrate transfer device 27 is constructed to convey a substrate, with respect to which a plating process applied thereto has been completed, to the washing device 50, and take the washed substrate out of the washing device 50. Thereafter, the washed substrate is delivered to the handling stage 26 (the handling stage 26B for unloading) by the substrate transfer device 27, and returned to the cassette 25*a* via the robot 24.

The pre-processing/post-processing module 120A comprises a pre-wet tank 32, a pre-soak tank 33, a pre-rinse tank 34, a blow tank 35, and a rinse tank 36. In the pre-wet tank 32, a substrate is soaked into pure water. In the pre-soak tank 33, an oxide film on a surface of a conductive layer, such as a seed layer or the like, formed on a surface of a substrate is removed by etching. In the pre-rinse tank 34, a substrate, with respect to which a pre-soaking process applied thereto has been completed, is washed together with a substrate holder by using cleaning liquid (pure water or the like). In the blow tank 35, liquid removal of a washed substrate is performed. In the rinse tank 36, a plated substrate is washed together with a substrate holder by using cleaning liquid. In this regard, the construction of the pre-processing/post-processing module 120A in the plating apparatus 100 is a mere example, so that the construction of the pre-processing/post-processing module 120A in the plating apparatus 100 is not limited thereto, and a different construction may be adopted therein.

The plating processing module 120B is constructed, for example, in such a manner that plural plating tanks 39 are housed in the inside of an overflow tank 38. Each plating tank 39 is constructed in such a manner that it stores a single substrate therein, and makes the substrate be soaked into plating liquid held in the inside thereof and applies plating such as copper plating or the like to a surface of the substrate.

The plating apparatus 100 comprises a transporter 37 which adopts a linear motor system, for example, and is arranged in a position on a side of the pre-processing/post-processing module 120A and the plating processing module 120B for conveying a substrate holder together with a substrate. The transporter 37 is constructed to convey a substrate holder between the fixing station 29, the stocker 30, the pre-wet tank 32, the pre-soak tank 33, the pre-rinse tank 34, the blow tank 35, the rinse tank 36, and the plating tank 39.

An example of a series of plating processes performed by the plating apparatus 100 will be explained. First, by the robot 24, a single substrate is taken out of the cassette 25*a* loaded in the cassette table 25, and the substrate is conveyed to the handling stage 26 (the handling stage 26A for loading). The handling stage 26 aligns the position and the direction of the conveyed substrate with a predetermined position and a predetermined direction. The substrate, with respect to which the position and the direction have been aligned in the handling stage 26, is conveyed to the fixing station 29 by the substrate transfer device 27.

On the other hand, a substrate holder stored in the stocker 30 is conveyed to the fixing station 29 by the transporter 37, and put horizontally on the fixing station 29. Thereafter, the substrate conveyed by the substrate transfer device 27 is put on the substrate holder which is in the above state, and the substrate and the substrate holder are coupled with each other.

Next, the substrate holder, which holds the substrate, is grasped by the transporter 37 to store it in the pre-wet tank 32. Next, the substrate holder, which holds the substrate with respect to which the process applied thereto in the pre-wet tank 32 has been completed, is conveyed to the pre-soak tank 33 by the transporter 37, to etch an oxide film on the substrate in the pre-soak tank 33. Following thereto, the substrate holder, which holds the above substrate, is conveyed to the pre-rinse tank 34 to water-wash the surface of the substrate by pure water stored in the pre-rinse tank 34.

The substrate holder, which holds the substrate, with respect to which the water-washing process applied thereto has been completed, is conveyed from the pre-rinse tank 34 to the plating processing module 120B by the transporter 37 to store it in the plating tank 39 which is filled with plating liquid. The transporter 37 repeats the above procedures sequentially to store respective substrate holders, which hold respective substrates, in respective plating tanks 39 in the processing module 120B sequentially.

In each of the plating tanks 39, a surface of the substrate is plated by applying a plating voltage between an anode (which is not shown in the figure) in the plating tank 39 and the substrate.

After completion of plating, the substrate holder, which holds the plated substrate, is grasped by the transporter 37 and conveyed to the rinse tank 36 to soak it into pure water stored in the rinse tank 36 to wash the surface of the substrate by the pure water. Next, the substrate holder is conveyed to the blow tank 35 by the transporter 37 to remove water droplets remaining on the substrate holder by air-blowing or the like. Thereafter, the substrate holder is conveyed to the fixing station 29 by the transporter 37.

In the fixing station 29, the processed substrate is taken out of the substrate holder by the substrate transfer device 27, and conveyed to the washing device 50 in the washing module 50*a*. The washing device 50 washes and dries the substrate, with respect to which the plating process applied thereto has been completed. The dried substrate is delivered to the handling stage 26 (the handling stage 26B for unloading) by the substrate transfer device 27, and returned to the cassette 25*a* via the robot 24.

As explained above, in the plating apparatus 100 according to the present embodiment, the substrate is taken out of the cassette 25*a* put on the cassette table 25, and conveyed to the fixing station 29 to connect it with the substrate holder. The plating apparatus 100 according to the present embodiment comprises plural sensors (which are not shown in FIG. 1) for measuring the size and the shape of a substrate before connecting the substrate to a substrate holder. In the following description, further explanation relating to measurement of a substrate in the plating apparatus 100 will be provided.

Figure 2:
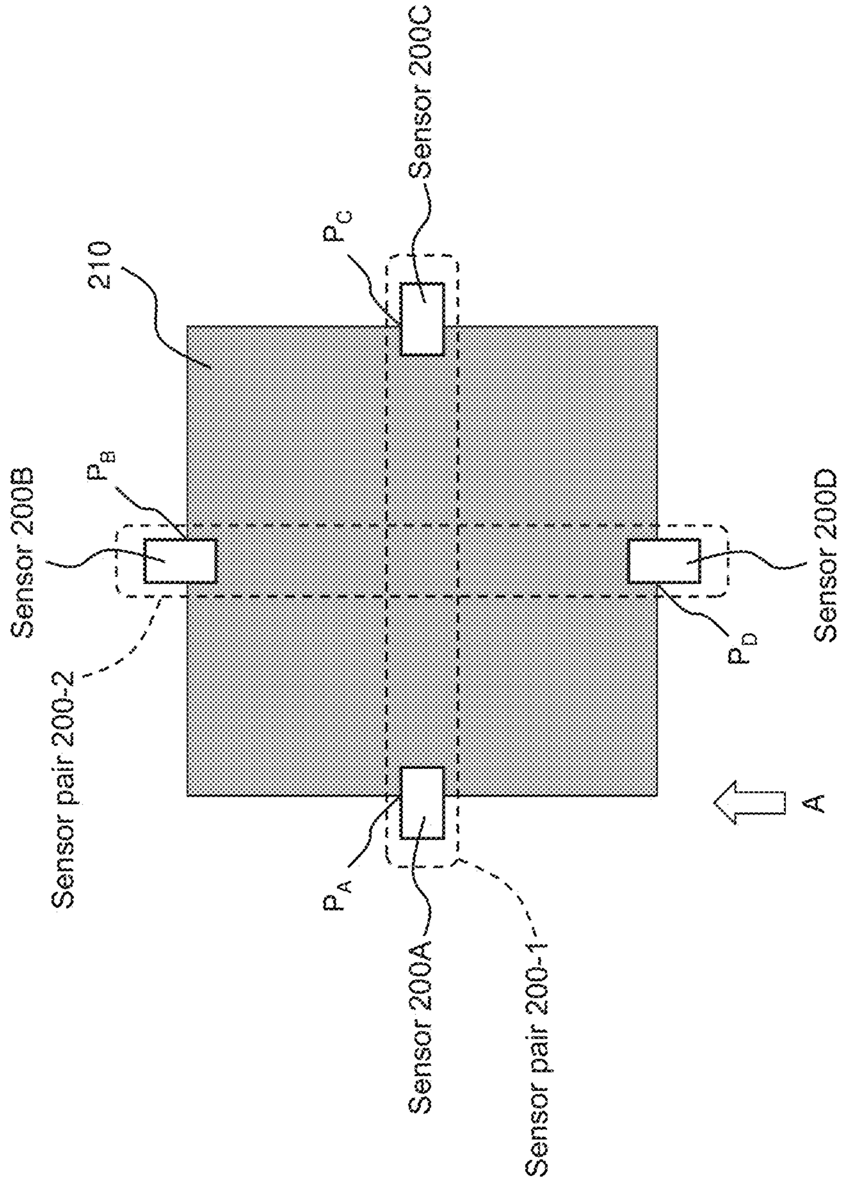
FIG. 2 is a figure showing plural sensors which are components of a plating apparatus according to a present embodiment, and a substrate which is being measured by using the plural sensors.

FIG. 2 is a figure showing plural sensors 200 which are components of the plating apparatus 100 according to the present embodiment, and a substrate 210 which is being measured by using the plural sensors 200. The plural sensors 200 are arranged in positions on the path through which the substrate 210 taken out of the cassette 25*a* is conveyed to the fixing station 29. With respect to the substrate 210, the size and the shape thereof are measured by the plural sensors 200, in a position in the middle of the conveyance path from the cassette 25*a* to the fixing station 29. The positions where the plural sensors 200 are arranged may be any positions on the conveyance path. For example, the plural sensors 200 may be arranged in the handling stage 26. When aligning of the substrate 210 is performed by the handling stage 26, the size and the shape of the substrate 210 is measured by the plural sensor 200. In a different construction, the plating apparatus 100 may comprise a stage, that is used for measuring the substrate 210, in the middle of the conveyance path from the cassette 25*a* to the fixing station 29, and the measurement stage may be provided with the plural sensors 200. The substrate 210 is put on the measurement stage temporarily by the robot 24 or the substrate transfer device 27, and, in the measurement stage, measurement of the substrate 210 is performed by using the plural sensors 200.

The substrate 210 handled by the plating apparatus 100 according to the present embodiment is a rectangular substrate. In the present embodiment, a rectangular substrate refers to a substrate wherein a substrate surface thereof, on which plating processing is applied by the plating apparatus 100 (or a substrate surface on which processing is applied by a semiconductor manufacturing apparatus of a different kind), has a square shape or a rectangular shape. For example, the rectangular substrate 210, which has a shape such as that explained above, may be a printed substrate or a glass substrate. In this regard, as will be explained below, the plating apparatus 100 has a function for judging whether the substrate 210 duly has a square or rectangular substrate surface. Thus, in the case that the term "rectangular substrate 210" is used in the following description, the expression ideally means a substrate having a substrate surface having an exact square or rectangular shape, and, in addition thereto, may mean a substrate having a substrate surface having a shape that slightly deviates from a square or rectangular shape.

In the example in FIG. 2, the plural sensors 200 comprises four sensors 200A, 200B, 200C, and 200D. The sensor 200A and the sensor 200C are arranged on a first line (the line in the horizontal direction in FIG. 2) that crosses two sides, that are opposite to each other, of the rectangular substrate 210 and is perpendicular to the two sides, and form a first sensor pair 200-1. The sensor 200B and the sensor 200D are arranged on a second line (the line in the vertical direction in FIG. 2) that crosses other two sides, that are opposite to each other, of the rectangular substrate 210 and is perpendicular to the other two sides, and form a second sensor pair 200-2. The first sensor pair 200-1 measures the length L1 of the rectangular substrate 210 along the first line (that is, the horizontal length of the rectangular substrate 210), and the second sensor pair 200-2 measures the length L2 of the rectangular substrate 210 along the second line (that is, the vertical length of the rectangular substrate 210).

The sensors 200A, 200B, 200C, and 200D are constructed to detect positions of edges of the sides of the rectangular substrate 210, respectively. Specifically, the sensor 200A detects a position $P_A$ of one of the edges of the rectangular substrate 210 on the first line, and the sensor 200C detects a position $P_C$ of the other of the edges of the rectangular substrate 210 on the first line. Based on the positions $P_A$ and $P_C$ of the above two edges, the length L1 of the rectangular substrate 210 along the first line can be obtained. Further, the sensor 200B detects a position $P_B$ of one of the edges of the rectangular substrate 210 on the second line, and the sensor 200D detects a position $P_D$ of the other of the edges of the rectangular substrate 210 on the second line. Based on the positions $P_B$ and $P_D$ of the above two edges, the length L2 of the rectangular substrate 210 along the second line can be obtained. Detection of the position of the edge of the rectangular substrate 210 by each sensor 200 may be based on, for example, measurement of the quantity of belt-shaped measuring light 220 (for example, laser light) blocked by the rectangular substrate 210.

Figure 3:
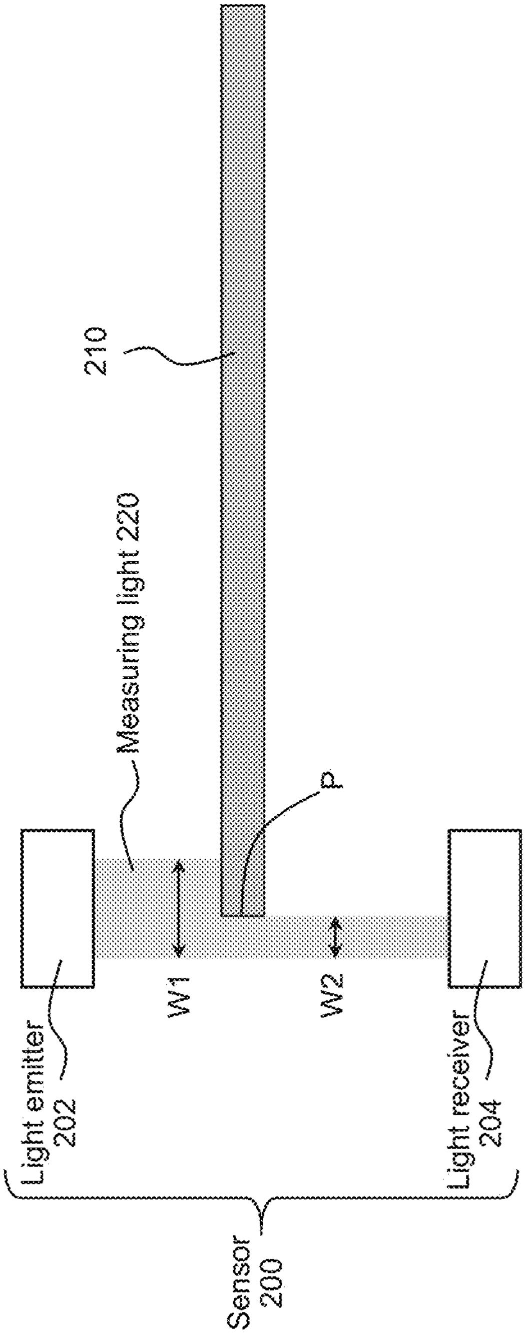
FIG. 3 is a figure showing a construction of a sensor and an operation method of the sensor.

FIG. 3 is a figure showing a construction of a sensor 200 (for example, the sensor 200A) and an operation method of the sensor. The above figure shows, for example, a state of the sensor 200A viewed from the direction of an arrow A in FIG. 2. As shown in FIG. 3, the sensor 200 comprises a light emitter 202 and a light receiver 204. The light emitter 202 is arranged in a position on a side of the rectangular substrate 210, and the light receiver 204 is arranged in a position on a side that is opposite to the side where the light emitter 202 is arranged. The light emitter 202 is constructed and arranged in such a manner that it emits belt-shaped measuring light 220 toward the rectangular substrate 210 (for example, in the direction perpendicular to the rectangular substrate 210). For example, the measuring light 220 has a width W1 in the direction perpendicular to the direction of propagation of the measuring light 220. A part, in the width direction, of the measuring light 220 is blocked by the rectangular substrate 210, and the remaining part of the measuring light 220 passes over the rectangular substrate 210 and propagates toward the light receiver 204. The width W2 of the measuring light 220 propagating toward the side where the light receiver 204 has been arranged is dependent on the position P (for example, the position $P_A$ in FIG. 2) of an edge of the rectangular substrate 210. The light receiver 204 is constructed and arranged in such a manner that it can receive the measuring light 220 having the width W2. Thus, based on the quantity of the measuring light 220 received by the light receiver 204 (or based on the ratio of the quantity of the measuring light 220 received by the light receiver 204 to the quantity of the measuring light 220 emitted from the light emitter 202), the position P of the edge of the rectangular substrate 210 can be detected.

In the manner explained above, by using the sensors 200A, 200B, 200C, and 200D included in the plating apparatus 100, the positions P of the edges of the rectangular substrate 210 are detected, respectively. Thus, by using the first sensor pair 200-1, the length L1 of the rectangular substrate 210 in the horizontal direction is measured based on the positions $P_A$ and $P_C$ of the edges, and, by using the second sensor pair 200-2, the length L2 of the rectangular substrate 210 in the vertical direction is measured based on the positions $P_B$ and $P_D$ of the edges. In this manner, the plating apparatus 100 can obtain information of the size of a substrate (i.e., L1 and L2), in a stage before the stage for connecting a rectangular substrate 210 to a substrate holder.

Figure 4:
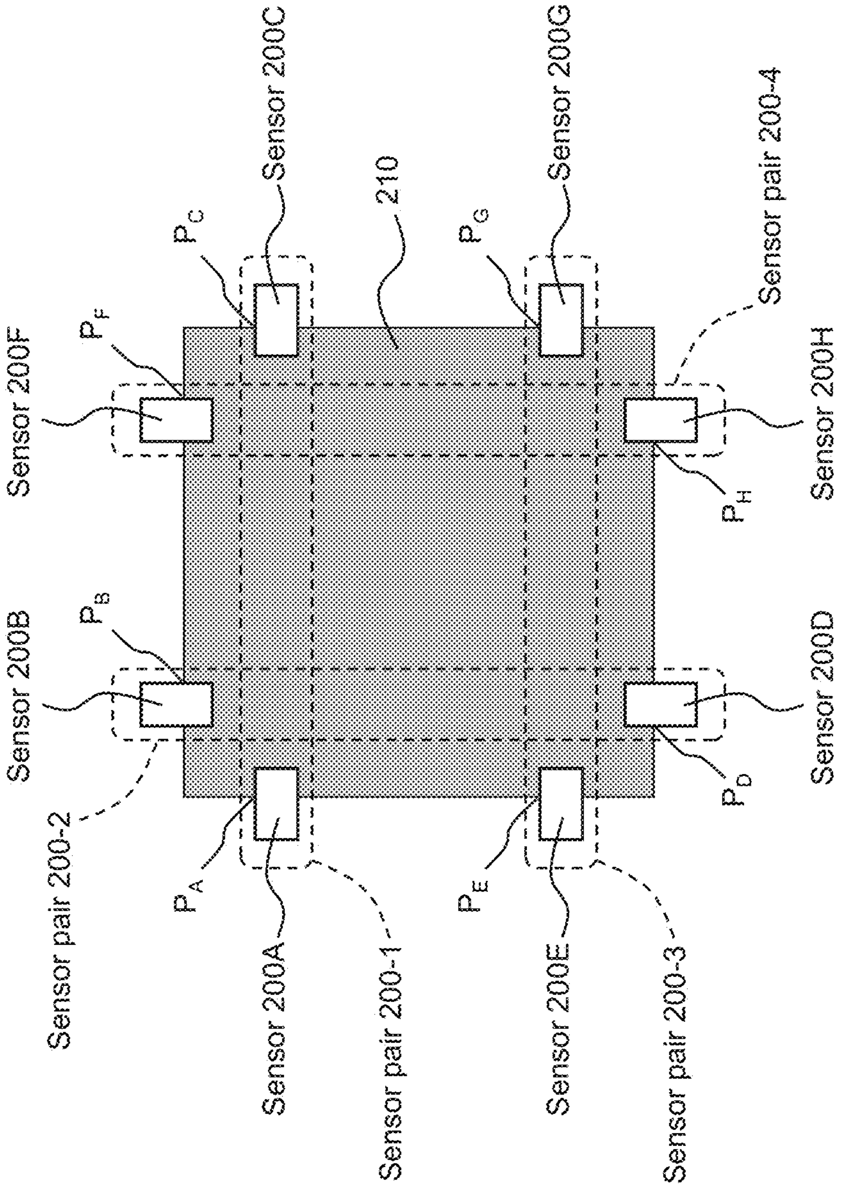
FIG. 4 is a figure showing plural sensors which are components of a plating apparatus according to a present embodiment, and a substrate which is being measured by using the plural sensors.

FIG. 4 is a figure showing plural sensors 200 which are components of a plating apparatus 100 according to a present embodiment, and a substrate 210 which is being measured by using the plural sensors 200, wherein the example shown in FIG. 4 is different from that shown in FIG. 2. In the example shown in FIG. 4, the plural sensors 200 comprises eight sensors, specifically, sensors 200A, 200B, 200C, 200D, 200E, 200F, 200G, and 200H. In the above sensors, the sensors 200A, 200B, 200C, and 200D form a first sensor pair 200-1 and a second sensor pair 200-2 in a manner similar to that in the example shown in FIG. 2. Further, in addition to the first sensor pair 200-1 and the second sensor pair 200-2, the sensors 200E and 200G form a third sensor pair 200-3 and the sensors 200F and 200H form a fourth sensor pair 200-4. The third sensor pair 200-3 (i.e., the sensors 200E and 200G) are arranged on a third line that is a line parallel to a first line relating to the first sensor pair 200-1 and crosses sides of the rectangular substrate 210, and the fourth sensor pair 200-4 (i.e., the sensors 200F and 200H) are arranged on a fourth line that is a line parallel to a second line relating to the second sensor pair 200-2 and crosses sides of the rectangular substrate 210.

As explained above with reference to FIG. 2, the first sensor pair 200-1 and the second sensor pair 200-2 measure the length L1 and the length L2 of the rectangular substrate 210 along the first line and the second line, respectively. Further, in the example shown in FIG. 4, the third sensor pair 200-3 measures, in a manner similar to that in the case of the first sensor pair 200-1, a length L3 of the rectangular substrate 210 along the third line, and the fourth sensor pair 200-4 measures, in a manner similar to that in the case of the second sensor pair 200-2, a length L4 of the rectangular substrate 210 along the fourth line. As explained above, in the example shown in FIG. 4, the lengths of two parts of the rectangular substrate 210 in the horizontal direction, i.e., the part along the first line and the part along the third line (the lengths L1 and L3), are measured, and the lengths of two parts of the rectangular substrate 210 in the vertical direction, i.e., the part along the second line and the part along the fourth line (the lengths L2 and L4), are measured.

In this regard, the method for measuring the length L3 by using the third sensor pair 200-3 and the method for measuring the length L4 by using the fourth sensor pair 200-4 are the same as those explained in relation to the first sensor pair 200-1 and the second sensor pair 200-2. That is, the length L3 of the rectangular substrate 210 along the third line can be obtained based on detection, by the sensor 200E, of a position PE of one of the edges of the rectangular substrate 210 on the third line (refer to FIG. 3: the same hereinafter) and detection, by the sensor 200G, of a position PG of the other of the edges of the rectangular substrate 210 on the third line. Further, in a manner similar to the above manner, the length L4 of the rectangular substrate 210 along the fourth line can be obtained based on detection, by the sensor 200F, of a position $P_F$ of one of the edges of the rectangular substrate 210 on the fourth line and detection, by the sensor 200H, of a position PH of the other of the edges of the rectangular substrate 210 on the fourth line.

Figure 5:
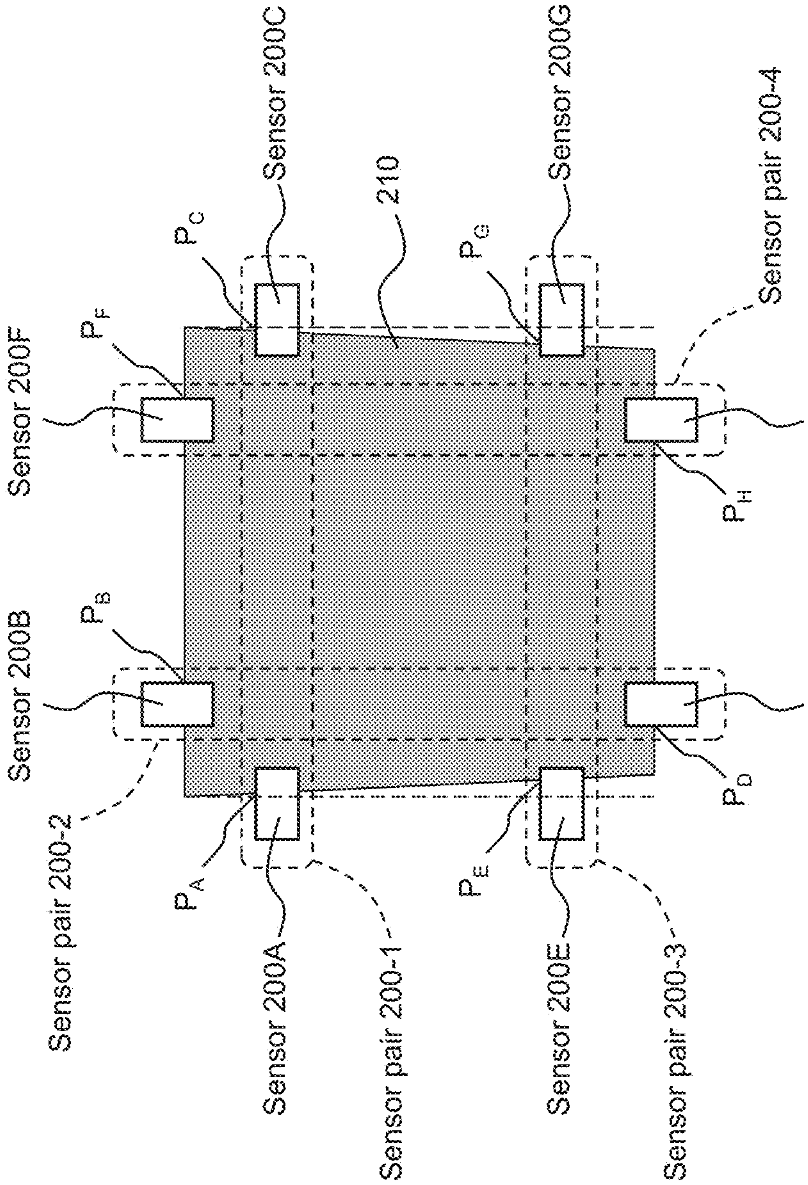
FIG. 5 is a figure showing plural sensors which are components of a plating apparatus according to a present embodiment, and a substrate which is being measured by using the plural sensors.

In the example shown in FIG. 4, information relating to the shape of a substrate, in addition to information of the size of the substrate (i.e., L1, L2, L3, and L4), can be obtained. For example, if L1=L3 and L2=L4, it can be judged that the substrate 210 has a square or rectangular shape, and, if not, it can be judged that the substrate 210 does not has an exact square or rectangular shape (the shape is distorted). For example, as shown in FIG. 5, in the case that the length L1 measured by the first sensor pair 200-1 and the length L3 measured by the third sensor pair 200-3 are not equal to each other (i.e. L1≠L3) although the length L2 measured by the second sensor pair 200-2 and the length L4 measured by the fourth sensor pair 200-4 are equal to each other (i.e., L2=L4), it can be judged that the substrate 210 has a trapezoidal shape.

Figure 6:
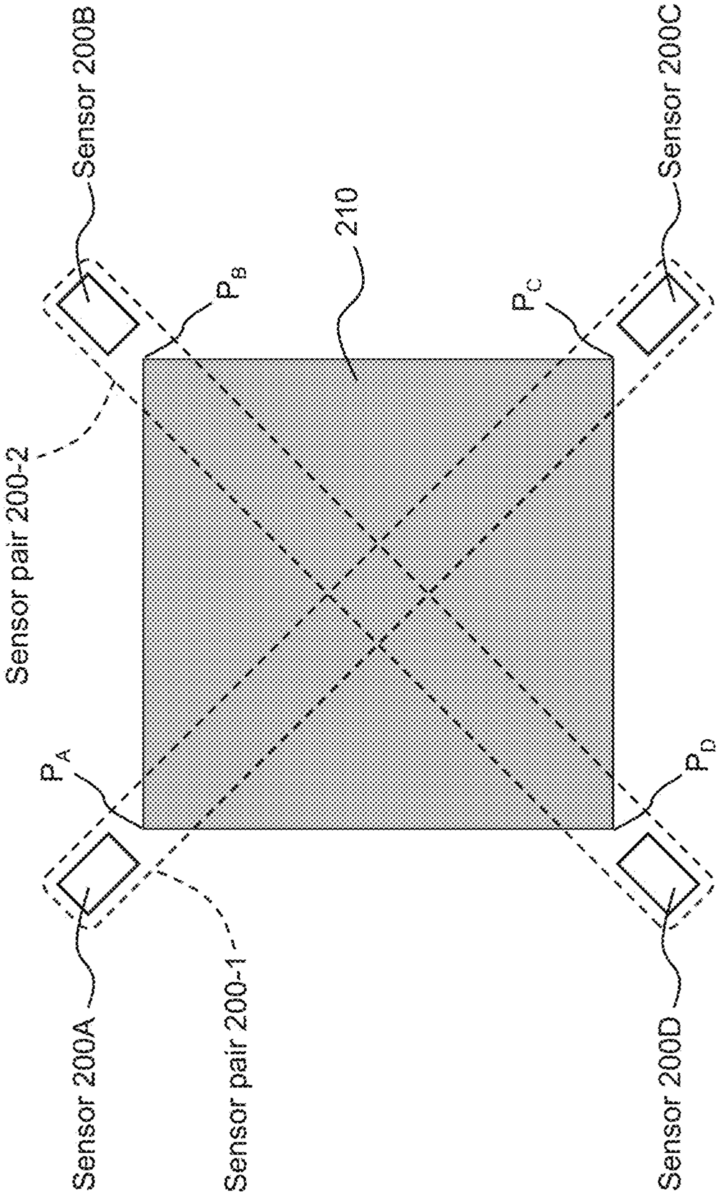
FIG. 6 is a figure showing plural sensors which are components of a plating apparatus according to a present embodiment, and a substrate which is being measured by using the plural sensors.

FIG. 6 is a figure showing plural sensors 200 which are components of a plating apparatus 100 according to a present embodiment, and a substrate 210 which is being measured by using the plural sensors 200, wherein the example shown in FIG. 6 is different from those shown in FIGS. 2 and 4. In the example shown in FIG. 6, the plural sensors 200 comprise four sensors 200A, 200B, 200C, and 200D. The sensors 200A and 200C are arranged on one of two lines diagonally passing through a rectangular substrate 210 (a first line), and form a first sensor pair 200-1. The sensors 200B and 200D are arranged on the other of the two lines diagonally passing through the rectangular substrate 210 (a second line), and form a second sensor pair 200-2. The first sensor pair 200-1 measures a length L1 of the rectangular substrate 210 along the first line (i.e., the length of one of the diagonal lines of the rectangular substrate 210), and the second sensor pair 200-2 measures a length L2 of the rectangular substrate 210 along the second line (i.e., the length of the other of the diagonal lines of the rectangular substrate 210).

The sensors 200A, 200B, 200C, and 200D are constructed to detect positions of vertexes of the rectangular substrate 210, respectively. Specifically, the sensor 200A detects a position $P_A$ of one of vertexes on the first diagonal line (the first line) of the rectangular substrate 210, and the sensor 200C detects a position $P_C$ of the other of vertexes on the first diagonal line of the rectangular substrate 210. Based on the positions $P_A$ and $P_C$ of the two vertexes, the length L1 of the first diagonal line of the rectangular substrate 210 can be obtained. Similarly, the sensor 200B detects a position $P_B$ of one of vertexes on the second diagonal line (the second line) of the rectangular substrate 210, and the sensor 200D detects a position $P_D$ of the other of vertexes on the second diagonal line of the rectangular substrate 210. Based on the positions $P_B$ and $P_D$ of the two vertexes, the length L2 of the second diagonal line of the rectangular substrate 210 can be obtained. The sensors 200 may be cameras arranged in positions close to vertexes of the rectangular substrate 210, respectively, for example. In the example shown in FIG. 6, detection of each of the vertexes of the rectangular substrate 210 can be based on image processing (for example, edge detection) of an image taken by a camera (the sensor 200) arranged at each of four corners of the rectangular substrate 210.

Figure 7:
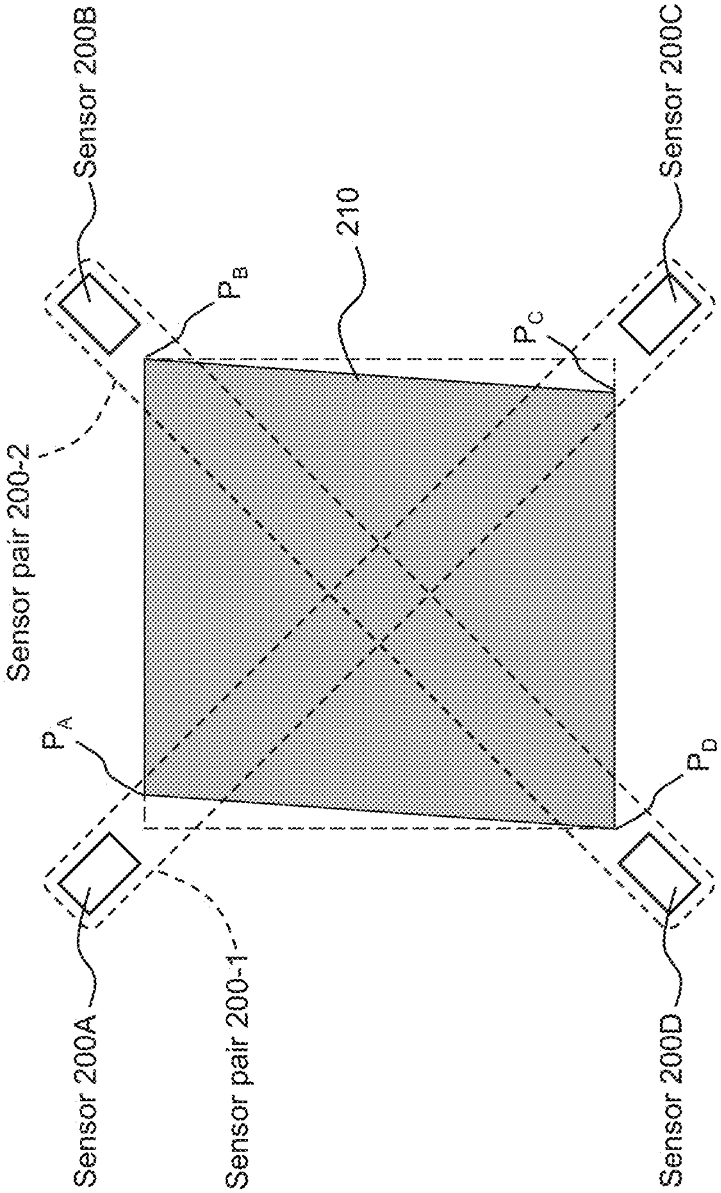
FIG. 7 is a figure showing plural sensors which are components of a plating apparatus according to a present embodiment, and a substrate which is being measured by using the plural sensors.

As explained above, in the exampled shown in FIG. 6, by using the first sensor pair 200-1, the length L1 of the first diagonal line of the rectangular substrate 210 is measured based on the detected positions $P_A$ and $P_C$ of the vertexes, and, by using the second sensor pair 200-2, the length L2 of the second diagonal line of the rectangular substrate 210 is measured based on the detected positions $P_B$ and $P_D$ of the vertexes. In the manner explained above, the plating apparatus 100 can obtain information of the size of a substrate (i.e., L1 and L2), in a stage before the stage for connecting a rectangular substrate 210 to a substrate holder. Further, it is possible to obtain information relating the shape of the substrate. For example, if L1=L2, it can be judged that the substrate 210 has a square or rectangular shape, and, if not, it can be judged that the substrate 210 does not has an exact square or rectangular shape (the shape is distorted). For example, as shown in FIG. 7, in the case that the length L1 measured by the first sensor pair 200-1 and the length L2 measured by the second sensor pair 200-2 are not equal to each other (i.e. L1≠L2), it can be judged that the substrate 210 has a parallelogram shape.

Figure 8:
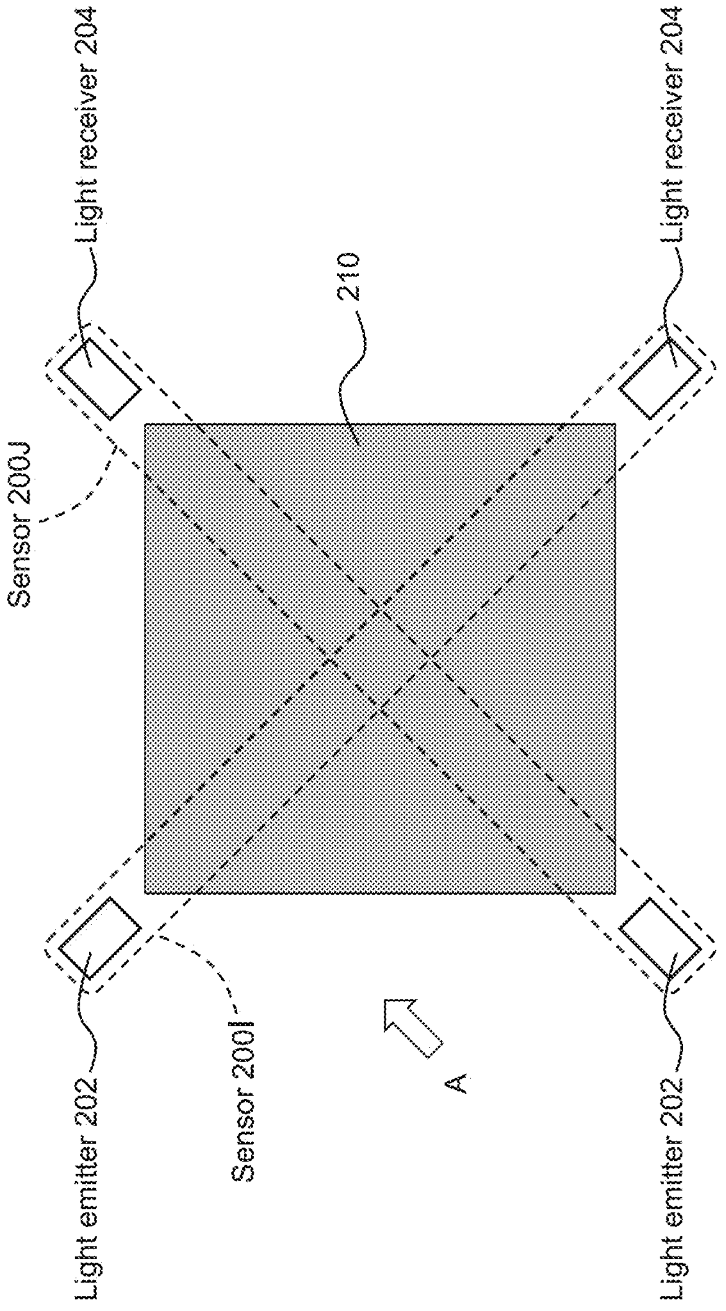
FIG. 8 is a figure showing plural sensors which are components of a plating apparatus according to a present embodiment, and a substrate which is being measured by using the plural sensors.

FIG. 8 is a figure showing plural sensors 200 which are components of a plating apparatus according to a present embodiment, and a substrate 210 which is being measured by using the plural sensors 200, wherein the example shown in FIG. 8 is different from those shown in FIGS. 2, 4, and 6. In the example shown in FIG. 8, the plural sensors 200 comprise two sensors 200I and 200J. Each of the sensors 200I and 200J comprises a light emitter 202 and a light receiver 204. The light emitter 202 and the light receiver 204 in the sensor 200I are arranged on one of two lines diagonally passing through the rectangular substrate 210, and the light emitter 202 and the light receiver 204 in the sensor 200J are arranged on the other of the two lines diagonally passing through the rectangular substrate 210.

Figure 9:
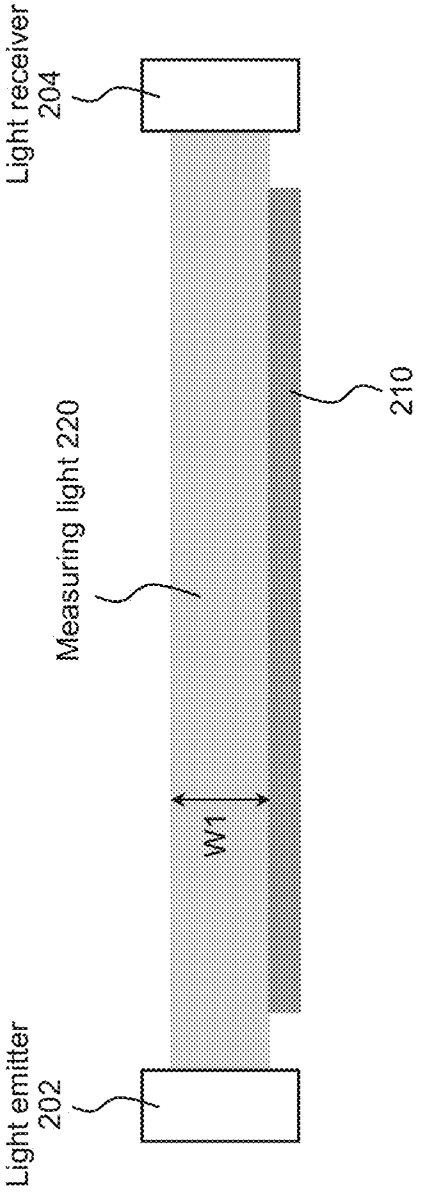
FIG. 9 is a figure showing an operation method of a sensor.

FIG. 9 is a figure showing an operation method of one of the sensors 200 (for example, the sensor 200I) in the example shown in FIG. 8. For example, FIG. 9 shows a state of the substrate 210 and the sensor 200I viewed from the direction of an arrow A in FIG. 8. As shown in FIG. 9, the light emitter 202 of the sensor 200I is arranged in a position close to one end of a diagonal line of the rectangular substrate 210, and the light receiver 204 of the sensor 200I is arranged in a position close to the other end of the diagonal line of the rectangular substrate 210. The light emitter 202 is constructed and arranged in such a manner that it emits belt-shaped measuring light 220 in parallel with the rectangular substrate 210 (i.e., along the surface of the rectangular substrate 210). For example, the measuring light 220 has a width W1 in a direction perpendicular to its propagation direction and also perpendicular to the surface of the substrate 210. In the case that the substrate 210 is flat, the measuring light 220 arrives at the light receiver 204 without any blockage thereof by the substrate 210. Thus, the light receiver 204 receives the measuring light 220 having the width W1 as it stands.

Figure 10:
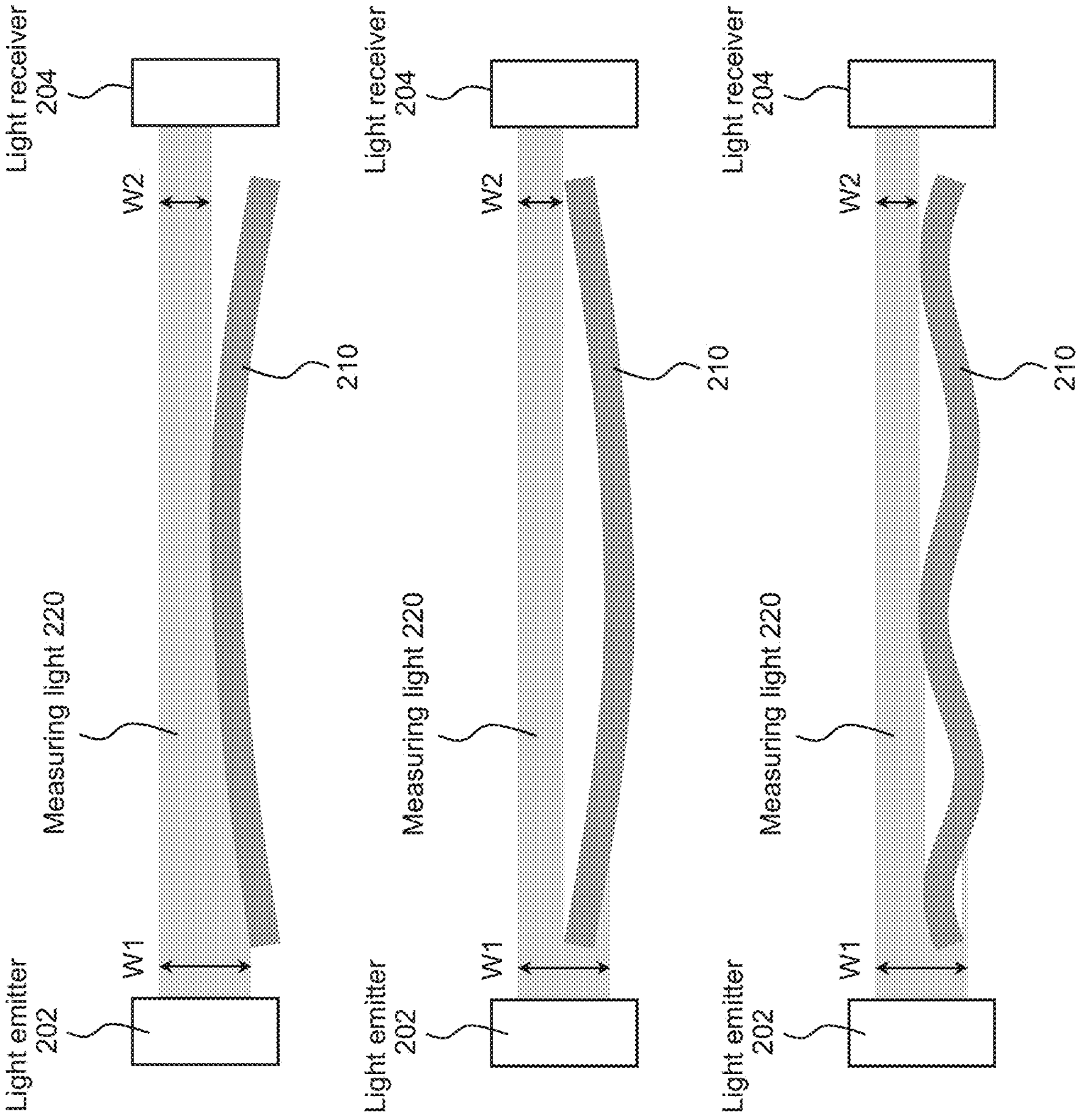
FIG. 10 is a figure showing an operation method of a sensor.

FIG. 10 shows states of the measuring light 220 in the cases that the rectangular substrates 210 have warps or undulation. In each of the above cases, a part, in the width direction, of the measuring light 220 is blocked by the part of the warp or undulation in the rectangular substrate 210, and the remaining part of the measuring light 220 is received by the light receiver 204. Thus, based on the quantity of the measuring light 220 received by the light receiver 204 (or based on the ratio of the quantity of the measuring light 220 received by the light receiver 204 to the quantity of the measuring light 220 emitted from the light emitter 202), existence/nonexistence of the warp or undulation in the rectangular substrate 210 and/or the size of the warp or undulation can be identified.

In general, the warp or undulation in a substrate often exists only in a specific direction in a surface of the substrate. For example, there is a case that a rectangular substrate 210 has a warp in a lateral direction of the substrate, and has no warp in a longitudinal direction. According to the arrangement of the sensors shown in FIG. 8, the sensor 200I can detect a warp or undulation of a substrate existing in the direction of one of the diagonal lines of the rectangular substrate 210, and the sensor 200J can detect warp or undulation existing in a direction different from the above direction, i.e., the direction of the other of the diagonal lines of the rectangular substrate 210. Accordingly, by using the sensors 200I and 200J arranged in two different directions, a warp or undulation that may exist in the substrate 210 can surely be detected without overlooking it.

In this regard, the directions along those the sensors 200I and 200J are to be arranged are not limited to the directions of the diagonal lines of the rectangular substrate 210. For example, the light emitter 202 and the light receiver 204 of the sensor 200I may be arranged along a line of the rectangular substrate 210 in a lateral direction (i.e., arranged in a manner similar to the manner in the case of the first sensor pair 200-1 in FIG. 2), and the light emitter 202 and the light receiver 204 of the sensor 200J may be arranged along a line of the rectangular substrate 210 in a longitudinal direction (i.e., arranged in a manner similar to the manner in the case of the second sensor pair 200-2 in FIG. 2).

Figure 11:
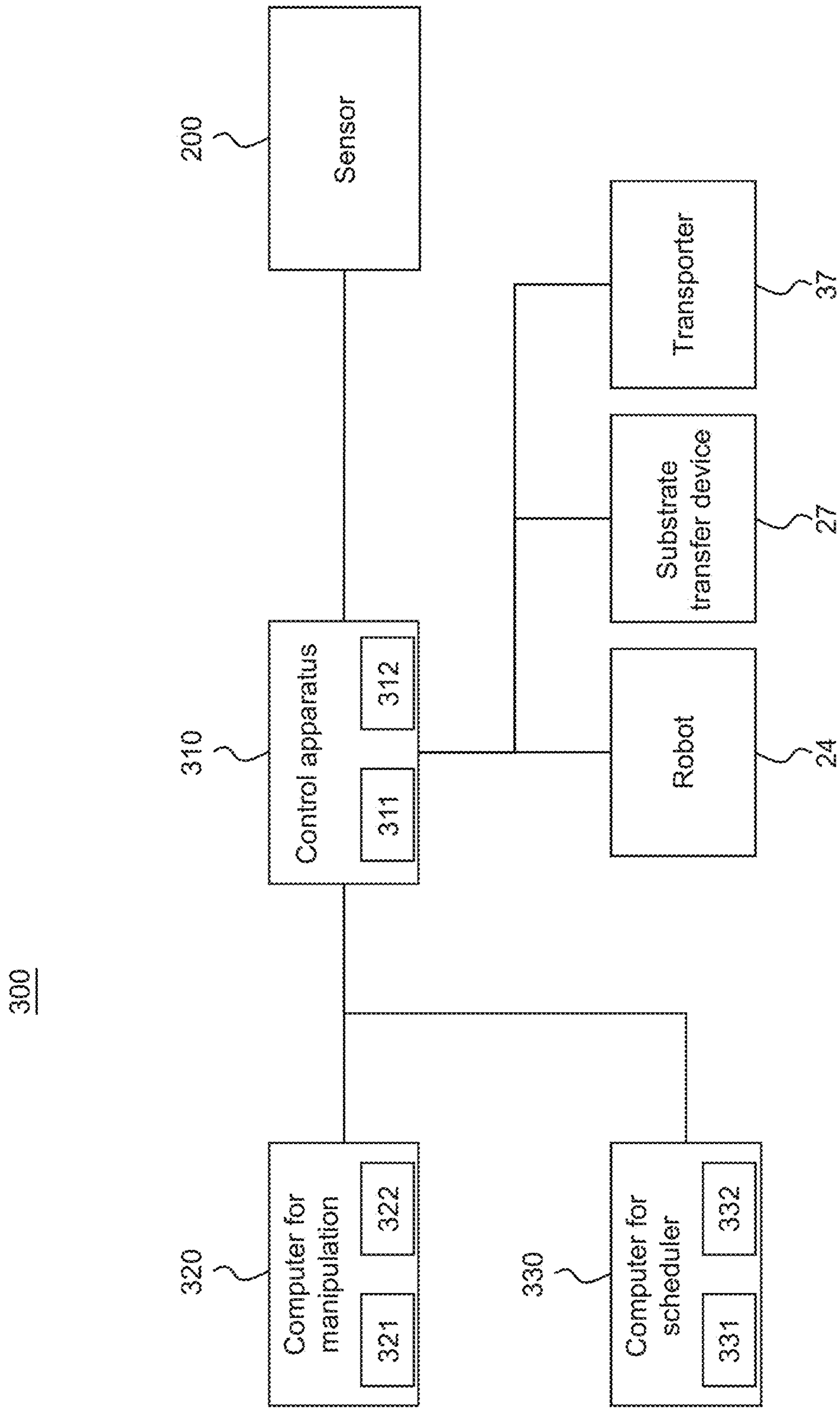
FIG. 11 is a configuration diagram of an example control system for controlling operation of a plating apparatus according to an embodiment of the present invention.

FIG. 11 is a configuration diagram of an example control system 300 for controlling operation of a plating apparatus 100 according to an embodiment of the present invention. The control system 300 comprises a control apparatus 310, a computer 320 for manipulation, and a computer 330 for a scheduler. Each of the control apparatus 310, the manipulation computer 320, and the scheduler computer 330 is communicably connected to others. The whole or part of the control apparatus 310, the manipulation computer 320, and the scheduler computer 330 may be incorporated in the plating apparatus 100 as part of components of the plating apparatus 100. The manipulation computer 320 and the scheduler computer 330 are shown as separate computers; however, a single computer comprising the above two computers may be constructed.

The control apparatus 310 is connected to the robot 24, the substrate transfer device 27, and the transporter 37 which have been explained with reference to FIG. 1, and to the plural sensors 200 which have been explained with reference to FIGS. 2-10. The control apparatus 310 sends instructions to the robot 24, the substrate transfer device 27, and the transporter 37 for activating them, and also obtains, from the sensors 200, information with respect to result of measurement relating to the rectangular substrate 210. For example, although it is preferable to make the control apparatus 310 comprise a PLC (Programmable Logic Controller), the control apparatus 310 may be a different kind of computer. Each of the manipulation computer 320 and the scheduler computer 330 may be constructed by incorporating predetermined application software (a program) into a general purpose computer. The control apparatus 310, the manipulation computer 320, and the scheduler computer 330 comprise processors (311, 321, and 331) and memories (312, 322, and 332), respectively. Predetermined programs are stored in the memories, respectively, and the functions of the control apparatus 310, the manipulation computer 320, and the scheduler computer 330 are realized by reading the programs from the memories and executing the programs by the processors, respectively.

Figure 12:
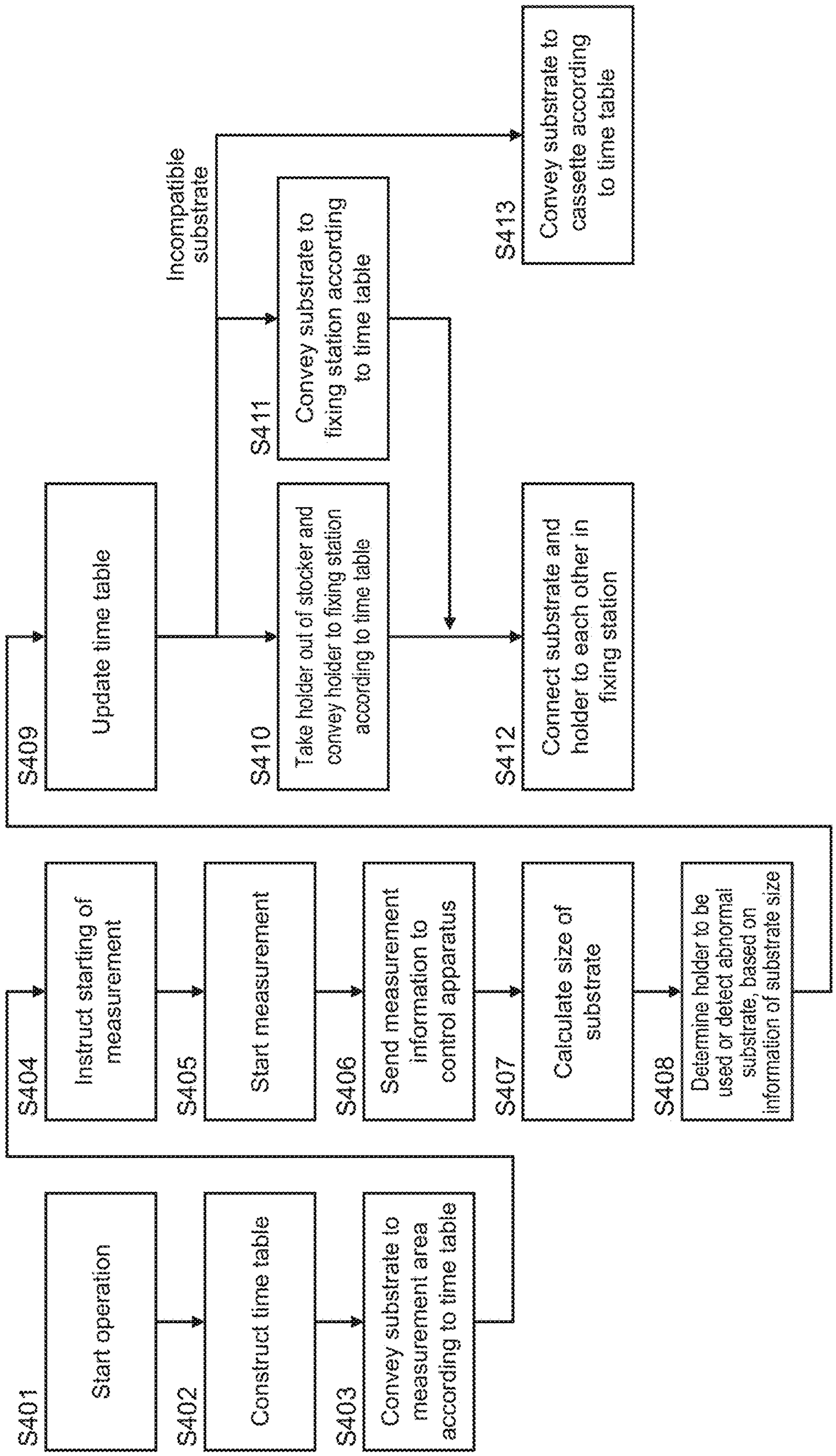
FIG. 12 is a flow chart showing operation of a plating apparatus according to an embodiment of the present invention.

FIG. 12 is a flow chart showing operation of a plating apparatus 100 according to an embodiment of the present invention. In the following description, operation of the plating apparatus 100 will be explained with reference to FIGS. 11 and 12.

First, in step S401, an instruction for starting operation of the plating apparatus 100 is inputted to the manipulation computer 320 by an operator of the plating apparatus 100. Inputting of the instruction for starting operation comprises, for example, inputting of information for designating a cassette 25*a* which stores a rectangular substrate 210 and/or information for designating details of plating processes (for example, the type of plating, the plated film thickness, the time of plating, and so on) applied to a substrate 210.

Next, in step S402, the scheduler computer 330 constructs a time table based on the instruction for starting operation. The time table comprises a substrate conveyance schedule relating to action to take a rectangular substrate 210 out of a cassette 25*a* and convey the rectangular substrate 210 to the fixing station 29, and a substrate-holder conveyance schedule relating to action to take a substrate holder out of the stocker 30 and convey the substrate holder to the fixing station 29. In a plating apparatus 100 in which plural kinds of substrate holders (plural kinds of substrate holders which have been designed to correspond to specific substrates having specific sizes and shapes, respectively) are stored in the stocker 30, it is assumed in step S402 that a default substrate holder is to be used in the plating apparatus 100, and a time table is constructed accordingly.

Next, in step S403, the control apparatus 310 makes the robot 24 and the substrate transfer device 27 perform action according to the time table. As a result, a rectangular substrate 210 is taken out of a cassette 25*a* and conveyed to a measurement area where plural sensors 200 have been installed. As explained above, the measurement area may be set in the handling stage 26 or may be set in a measurement stage arranged in a position in the middle of the conveyance path from the cassette 25*a* to the fixing station 29, for example.

Next, in step S404 that is performed after conveying the rectangular substrate 210 to the measurement area, the control apparatus 310 instructs the respective sensors 200 in the measurement area to start measurement of the substrate. After receiving the above instruction, the respective sensors 200 perform measurement of the rectangular substrate 210 in step S405, and, next, send data representing result of measurement to the control apparatus 310 in step S406. Details with respect to measurement of the rectangular substrate 210 are those that have been explained with reference to FIGS. 2-10. For example, in the example shown in FIG. 2, the sensors 200A, 200B, 200C, and 200D detect positions $P_A$, $P_B$, $P_C$, and $P_D$ of the edges of the rectangular substrate 210, respectively (step S405), and send data representing the respective positions to the control apparatus 310 (step S406). Regarding each of the examples of the sensors 200 shown in other figures, steps S405 and S406 are also performed therein in a manner similar to the above manner.

Next, in step S407, the control apparatus 310 calculates the size of the rectangular substrate 210, based on the data of measurement result obtained by the respective sensors 200. For example, in the above-explained example shown in FIG. 2, the length L1 of the rectangular substrate 210 in the lateral direction is calculated from the data of the edge positions $P_A$ and $P_C$, and the length L2 in the longitudinal direction is calculated from the data of the edge positions $P_B$ and $P_D$. Further, in addition to calculation of the size of the substrate, the control apparatus 310 may identify the shape of the rectangular substrate 210 (whether it has a square shape, a rectangular shape, or a shape other than the above shapes) as explained in relation to the above-explained examples shown in FIGS. 4 and 6, and/or perform detecting of a warp or undulation in the rectangular substrate 210 as explained in relation to the above-explained example shown in FIG. 8.

Next, in step S408, the control apparatus 310 performs judgment with respect to fitness between the rectangular substrate 210 and a substrate holder stored in the stocker 30, based on the size, the shape, and the warp or undulation of the rectangular substrate 210. For example, in the case that plural kinds of substrate holders exist in the stocker 30, the control apparatus 310 selects, from the plural kinds of substrate holders, a substrate holder which fits the size of the rectangular substrate 210, by comparing each of sizes of substrates which can be received by the substrate holders with the measured substrate size, wherein the sizes of the substrates have been stored in advance. Further, for example, in the cases that (i) no substrate holder, which fits the size of the rectangular substrate 210, exists in the stocker 30, (ii) the degree of deviation of the shape of the rectangular substrate 210 from a square shape or a rectangular shape is equal to or greater than a threshold value, (iii) the size of a warp or undulation in the rectangular substrate 210 is equal to or greater than a threshold value, or the like, the control apparatus 310 may judge that the rectangular substrate 210 is an incompatible (abnormal) substrate. Regarding each of the above cases (ii) and (iii), the threshold value, that is used for judging whether a rectangular substrate 210 is abnormal, may be allowed to be changed by an operator of the plating apparatus 100 by using the manipulation computer 320.

Next, in step S409, the scheduler computer 330 obtains information relating to fitness between the rectangular substrate 210 and the substrate holder from the control apparatus 310, and updates the time table based on the information. For example, the scheduler computer 330 replaces the default substrate holder relating to the time table constructed in the above-explained step S402 by the substrate holder (i.e., the substrate holder that fits the size of the rectangular substrate 210) selected by the control apparatus 310 in the step S408. Further, in the case that the rectangular substrate 210 is an incompatible (abnormal) substrate, the scheduler computer 330 rewrites the time table to avoid use of the above rectangular substrate 210 (i.e., to exclude the above rectangular substrate 210 from objects of processing by the plating apparatus 100).

In the case that the substrate holder relating to the time table is replaced by the substrate holder that fits the size of the rectangular substrate 210, step S410 and step S411 are performed next. On the other hand, in the case that the time table is rewritten to exclude the rectangular substrate 210 from objects of processing, step S413 is performed next.

In step S410, the control apparatus 310 makes the transporter 37 perform action according to the updated time table. As a result, a substrate holder which fits the size of the rectangular substrate 210 is selected from and taken out of the stocker 30, and conveyed to the fixing station 29. Further, in step S411, the control apparatus 310 makes the substrate transfer device 27 (or both the robot 24 and the substrate transfer device 27) perform, according to the time table, a normal-case processing action that is performed after measurement of a substrate. As a result, the measured rectangular substrate 210 is conveyed from the measurement area to the fixing station 29. Next, in step S412, the control apparatus 310 makes the substrate transfer device 27 perform action for connection between the substrate holder, which has been conveyed to the fixing station 29, and the rectangular substrate 210 (i.e., for making the rectangular substrate 210 be held by the substrate holder).

On the other hand, in step S413, the control apparatus 310 makes the robot 24 perform an abnormal-case processing action that is performed after measurement of a substrate. The abnormal-case processing action comprises at least one of an action performed by the robot 24 for returning the rectangular substrate 210, which is regarded as an incompatible substrate, to the cassette 25*a* and an action for activating an alarm device, which is installed in the robot 24 or a position other than positions in the robot 24, for communicating an alarm to an operator. It may be possible to adopt the construction that the operator manually returns the rectangular substrate 210 to the cassette 25*a* after communicating of the alarm.

As explained above, according to each of the plating apparatuses 100 according to the present embodiments, the size of a rectangular substrate 210 is measured by using plural sensors 200, and, based on result of measurement, a substrate holder which fits the size of the rectangular substrate 210 is selected. Thus, it becomes possible to connect a correct substrate holder to the rectangular substrate 210, and, as a result, prevent damaging of a substrate holder and prevent a rectangular substrate 210 from becoming a defective product due to a mismatch between sizes. Further, if it is judged as a result of measurement by the plural sensors 200 that a rectangular substrate 210 does not fit a substrate holder, abnormal-case processing actions such as an action for stopping conveying of a substrate, an action for communicating an alarm, and so on are performed. Thus, it becomes possible to prevent damaging of a substrate holder and prevent a rectangular substrate 210 from becoming a defective product due to connecting of, or due to an attempt to connect, an incompatible rectangular substrate 210 and a substrate holder with each other.

In the above description, embodiments of the present invention have been explained based on some examples; and, in this regard, the above explained embodiments of the present invention are those used for facilitating understanding of the present invention, and are not those used for limiting the present invention. It is obvious that the present invention can be changed or modified without departing from the scope of the gist thereof, and that the present invention includes equivalents thereof. Further, it is possible to arbitrarily combine components or omit a component(s) disclosed in the claims and the specification, within the scope that at least part of the above-stated problems can be solved or within the scope that at least part of advantageous effect can be obtained.

REFERENCE SIGNS LIST

24 Robot
25 Cassette table
25*a* Cassette
26 Handling stage
27 Substrate transfer device
29 Fixing station
30 Stocker
32 Pre-wet tank
33 Pre-soak tank
34 Pre-rinse tank
35 Blow tank
36 Rinse tank
37 Transporter
38 Overflow tank
39 Plating tank
50 Washing device
50*a* Washing module
100 Plating apparatus
110 Load/unload module
120 Processing module
120A Pre-processing/post-processing module
120B Plating processing module
200 (200A-200J) Sensor
200-1 First sensor pair
200-2 Second sensor pair
200-3 Third sensor pair
200-4 Fourth sensor pair
202 Light emitter
204 Light receiver
210 Substrate
220 Measuring light
300 Control system
310 Control apparatus
311 Processor
312 Memory
320 Computer for manipulation
321 Processor
322 Memory
330 Computer for scheduler
331 Processor
332 Memory

The invention claimed is:

1. A semiconductor manufacturing apparatus for processing a rectangular substrate, comprising:

a first sensor pair for measuring a first length of the rectangular substrate along a first line, wherein the first sensor pair comprises a sensor configured to detect a position of one edge of the rectangular substrate on the first line, and a sensor configured to detect a position of the other edge of the rectangular substrate on the first line;

a second sensor pair for measuring a second length of the rectangular substrate along a second line, wherein the second sensor pair comprises a sensor configured to detect a position of one edge of the rectangular substrate on the second line, and a sensor configured to detect a position of the other edge of the rectangular substrate on the second line;

wherein the first sensor pair and the second sensor pair are arranged in such a manner that the first line and the second line correspond to a lateral direction and a longitudinal direction, respectively, in the rectangular substrate;

a third sensor pair for measuring a third length of the rectangular substrate along a third line parallel to the first line or the second line, wherein the third sensor pair comprises a sensor configured to detect a position of one edge of the rectangular substrate on the third line, and a sensor configured to detect a position of the other edge of the rectangular substrate on the third line;

and one or plural processors;

wherein the processor is configured to:

calculate the first length based on the positions of the one edge and the other edge, that are on the first line and detected by the first sensor pair, of the rectangular substrate, calculate the second length based on the positions of the one edge and the other edge, that are on the second line and detected by the second sensor pair, of the rectangular substrate, calculate the third length based on the positions of the one edge and the other edge, that are on the third line and detected by the third sensor pair, of the rectangular substrate, identify the size or the shape of the rectangular substrate, based on the calculated first length and the calculated second length, identify deviation of the shape of the rectangular substrate from a square shape or a rectangular shape, based on the calculated first length, the calculated second length, and the calculated third length, perform at least one of (i) an action for discontinuing or suspending processing of the rectangular substrate and (ii) an action for communicating an alarm, in the case that the identified size, shape, or warp of the rectangular substrate is judged to be inappropriate in view of a predetermined criteria.

2. The semiconductor manufacturing apparatus as recited in claim 1, wherein the two sensors included in each of the sensor pairs comprise a light emitter which emits belt-shaped measuring light toward the rectangular substrate, and a light receiver which receives a part of the belt-shaped measuring light, wherein the part of the belt-shaped measuring light is light, in the belt-shaped measuring light, that was not blocked by the rectangular substrate; and detection of each of the positions of the rectangular substrate is based on the quantity of light received by the light receiver in the each sensor.

3. The semiconductor manufacturing apparatus as recited in claim 1 further comprising:

a substrate holder storage for storing plural kinds of substrate holders corresponding to rectangular substrates having different sizes and shapes, respectively, wherein each of the substrate holders is that for holding a rectangular substrate; wherein the processor is further configured to select, from the substrate holder storage, a substrate holder which fits the identified size or shape of the rectangular substrate.

4. The semiconductor manufacturing apparatus as recited in claim 1 further comprising a sensor for detecting a warp of the rectangular substrate, wherein the sensor comprises a light emitter which emits belt-shaped measuring light in a direction parallel to the rectangular substrate, and a light receiver which receives a part of the belt-shaped measuring light, wherein the part of the belt-shaped measuring light is light, in the belt-shaped measuring light, that was not blocked by the rectangular substrate; wherein the processor is further configured to identify a warp of the rectangular substrate based on the quantity of light received by the light receiver in the sensor.

5. A semiconductor manufacturing apparatus for processing a rectangular substrate, comprising:

a first sensor pair for measuring a first length of the rectangular substrate along a first line, wherein the first sensor pair comprises a sensor configured to detect a position of one edge of the rectangular substrate on the first line, and a sensor configured to detect a position of the other edge of the rectangular substrate on the first line;

a second sensor pair for measuring a second length of the rectangular substrate along a second line, wherein the second sensor pair comprises a sensor configured to detect a position of one edge of the rectangular substrate on the second line, and a sensor configured to detect a position of the other edge of the rectangular substrate on the second line;

wherein the first sensor pair and the second sensor pair are arranged in such a manner that two diagonal lines of the rectangular substrate are set as the first line and the second line, respectively;

and one or plural processors;

wherein the processor is configured to:

calculate the first length based on the positions of the one edge and the other edge, that are on the first line and detected by the first sensor pair, of the rectangular substrate, calculate the second length based on the positions of the one edge and the other edge, that are on the second line and detected by the second sensor pair, of the rectangular substrate, and identify the size or the shape of the rectangular substrate, based on the calculated first length and the calculated second length, perform at least one of (i) an action for discontinuing or suspending processing of the rectangular substrate and (ii) an action for communicating an alarm, in the case that the identified size, shape, or warp of the rectangular substrate is judged to be inappropriate in view of a predetermined criteria.

6. The semiconductor manufacturing apparatus as recited in claim 5, wherein the two sensors included in each of the sensor pairs comprise a light emitter which emits belt-shaped measuring light toward the rectangular substrate, and a light receiver which receives a part of the belt-shaped measuring light, wherein the part of the belt-shaped measuring light is light, in the belt-shaped measuring light, that was not blocked by the rectangular substrate; and detection of each of the positions of the rectangular substrate is based on the quantity of light received by the light receiver in the each sensor.

7. The semiconductor manufacturing apparatus as recited in claim 5 wherein each of the two sensors included in each of the sensor pairs is a camera arranged to take an image of one of four corners of the rectangular substrate; detection of the position by each of the sensors is detection of a vertex of the rectangular substrate based on edge detection in the image taken by each of the cameras; and calculation of the first length and the second length is calculation of lengths of the diagonal lines of the rectangular substrate, respectively, based on the detected vertexes.

8. The semiconductor manufacturing apparatus as recited in claim 5 further comprising:

a substrate holder storage for storing plural kinds of substrate holders corresponding to rectangular substrates having different sizes and shapes, respectively, wherein each of the substrate holders is that for holding a rectangular substrate; wherein the processor is further configured to select, from the substrate holder storage, a substrate holder which fits the identified size or shape of the rectangular substrate.

9. A semiconductor manufacturing apparatus for processing a rectangular substrate, comprising:

a first sensor pair for measuring a first length of the rectangular substrate along a first line, wherein the first sensor pair comprises a sensor configured to detect a position of one edge of the rectangular substrate on the first line, and a sensor configured to detect a position of the other edge of the rectangular substrate on the first line;

a second sensor pair for measuring a second length of the rectangular substrate along a second line, wherein the second sensor pair comprises a sensor configured to detect a position of one edge of the rectangular substrate on the second line, and a sensor configured to detect a position of the other edge of the rectangular substrate on the second line;

a sensor for detecting a warp of the rectangular substrate, wherein the sensor comprises a light emitter which emits belt-shaped measuring light in a direction parallel to the rectangular substrate, and a light receiver which receives a part of the belt-shaped measuring light that is not blocked by the rectangular substrate;

and one or plural processors;

wherein the processor is configured to:

calculate the first length based on the positions of the one edge and the other edge, that are on the first line and detected by the first sensor pair, of the rectangular substrate, calculate the second length based on the positions of the one edge and the other edge, that are on the second line and detected by the second sensor pair, of the rectangular substrate, and identify the size or the shape of the rectangular substrate, based on the calculated first length and the calculated second length, identify the warp of the rectangular substrate based on a quantity of light received by the light receiver, and perform at least one of (i) an action for discontinuing or suspending processing of the rectangular substrate and (ii) an action for communicating an alarm, in the case that the identified size, shape, or warp of the rectangular substrate is judged to be inappropriate in view of a predetermined criteria.

10. The semiconductor manufacturing apparatus as recited in claim 9, wherein the first sensor pair and the second sensor pair are arranged in such a manner that the first line and the second line correspond to a lateral direction and a longitudinal direction, respectively, in the rectangular substrate.

11. The semiconductor manufacturing apparatus as recited in claim 9, wherein the two sensors included in each of the sensor pairs comprise a light emitter which emits belt-shaped measuring light toward the rectangular substrate, and a light receiver which receives a part of the belt-shaped measuring light, wherein the part of the belt-shaped measuring light is light, in the belt-shaped measuring light, that was not blocked by the rectangular substrate; and detection of each of the positions of the rectangular substrate is based on the quantity of light received by the light receiver in the each sensor.

12. The semiconductor manufacturing apparatus as recited in claim 1 further comprising:

a substrate holder storage for storing plural kinds of substrate holders corresponding to rectangular substrates having different sizes and shapes, respectively, wherein each of the substrate holders is that for holding a rectangular substrate; wherein the processor is further configured to select, from the substrate holder storage, a substrate holder which fits the identified size or shape of the rectangular substrate.

* * * * *